United States Patent [19]

Sloane

[11] Patent Number: 4,583,075

[45] Date of Patent: Apr. 15, 1986

[54] METHOD AND APPARATUS FOR ANALYZING AN ANALOG-TO-DIGITAL CONVERTER WITH A NONIDEAL DIGITAL-TO-ANALOG CONVERTER

[75] Inventor: Edwin A. Sloane, Los Altos, Calif.

[73] Assignee: Fairchild Camera and Instrument Corporation, San Jose, Calif.

[21] Appl. No.: 539,359

[22] Filed: Oct. 6, 1983

Related U.S. Application Data

[63] Continuation-in-part of Ser. No. 364,374, Apr. 1, 1982, Pat. No. 4,465,995.

[51] Int. Cl.$^4$ ............................................. H03K 13/00
[52] U.S. Cl. ................................ 340/347 CC; 371/15; 324/73 R
[58] Field of Search ..... 340/347 CC, 347 R, 347 AD; 371/15, 26, 27, 23–25; 324/73 R, 73 AT, 130; 364/727, 826

[56] References Cited

U.S. PATENT DOCUMENTS

| | | | |
|---|---|---|---|
| 4,340,856 | 7/1982 | Orlandi | 324/73 R |
| 4,465,995 | 8/1984 | Sloane | 340/347 CC |

OTHER PUBLICATIONS

L. F. Pau, "Fast Testing and Trimming of A/D and D/A Converters in Automatic Test Systems", Published in the Proceedings of Autotestcon 1978 IEEE Catalog 78CH1416-7, Nov. 1978, pp. 268–274.

Sellier, "IBM Technical Disclosure Bulletin", vol. 22, No. 3, Aug. 1979, pp. 1039–1040.

*Primary Examiner*—Charles D. Miller
*Attorney, Agent, or Firm*—Theodore S. Park; Robert C. Colwell

[57] ABSTRACT

A method for statistically calibrating an analog-to-digital converter with an electronic test system. A digital-to-analog converter which has been calibrated by premeasured weighting coefficients with respect to two-state orthogonal signals is excited with two state signals at each input bit which together represent a single signal with uniform amplitude probability with respect to time, and wherein each excitation signal is orthogonal with respect to all other excitation signals. The output of the digital-to-analog converter is detected by the analog-to-digital converter under test. The digital time domain output signals are then mapped into a transform domain to obtain weighting coefficients of each bit of the output response. Finally the transform domain weighting coefficients are weighted by the reciprocal of the premeasured weighting coefficients to obtain the unbiased weight of each bit of the analog-to-digital converter under test. A preferred set of excitation signals is a set of Walsh function signals representing the digital equivalent of a linear ramp function.

10 Claims, 2 Drawing Figures

METHOD AND APPARATUS FOR ANALYZING AN ANALOG-TO-DIGITAL CONVERTER WITH A NONIDEAL DIGITAL-TO-ANALOG CONVERTER

This application is a continuation-in-part of copending patent application Ser. No. 364,374 filed Apr. 1, 1982 now U.S. Pat. No. 4,465,995.

BACKGROUND OF THE INVENTION

1. Field of Invention

This invention relates to automatic test systems for digital electronic converters and particularly to statistical methods and related electronic apparatus for testing analog-to-digital converters.

Converters between the digital and analog signal domains are employed to interface digital electronic circuitry and analog devices. Accuracy of conversion, gain and repeatability in the process of conversion are matters of concern. One method of testing an analog-to-digial converter is to apply a digital signal to the input of a digital-to-analog converter to obtain an analog output signal, and then to apply the analog output signal to the input of the analog-to-digital converter under test to recover a digital signal and then to compare the digital output signal with a standard such as the digital input signal or to process the output signal to determine its statistical characteristics. The characteristics of the output signal in terms of a statistical description provide an indication of the accuracy of the analog-to-digital converter.

2. Description of the Prior Art

State of the art testing techniques for digital converters are generally limited to testing a few states such as the simple binary weights and full-scale amplitude. Substantially all tests are static in nature and are incapable of providing a complete statistical evaluation of a converter.

One of the concerns of prior art converter testing methods has been an inability to distinguish between signal-induced biases or errors and biases or errors inherent in the testing devices. Accordingly, much effort has been devoted to linearization of the excitation signals and of the transfer characteristics of the measuring devices, such as the digital-to-analog converter used as a voltage reference to provide a calibrated input to the analog-to-digital converter under test. The present invention represents a departure from this effort to idealize the testing equipment.

3. Cross-Reference to Related Applications

In the copending patent application entitled "Method and Apparatus for Digital Converter Testing," Ser. No. 204,979, filed Nov. 7, 1980, a method and apparatus are disclosed for dynamically testing the overall performance characteristics of both digital-to-analog converters and analog-to-digital converters. The method comprises dynamically exercising an analog-to-digital or digital-to-analog converter with, respectively, analog or digital signal patterns which can be characterized as the sum of a set of mutually orthogonal two-state functions of defined amplitudes, the sum having substantially uniform amplitude distribution over the allowable states of the amplitude range in order to exercise substantially all allowable converter states of concern. Thereafter, the response of the converter under test is examined for a number of basic performance parameters, including total distortion, linearity and optimum gain. The method described therein yields a relatively complete statistical description of the performance characteristics. The disclosures of that application and the other copending patent application entitled "Method for Analyzing a Digital to Analog Converter with a Nonideal Analog to Digital Converter", Ser. No. 264,928, filed May 18, 1981, are incorporated herein by reference and made a part hereof.

SUMMARY OF THE INVENTION

According to the invention, an analog-to-digital converter (ADC) under test is calibrated by exciting the digital inputs of a digital-to-analog converter (DAC) which has been calibrated by premeasured weighting coefficients with respect to two state orthogonal signals from an exciter which generates, at each bit input, a known two-state signal which is orthogonal with respect to all other excitation signals, the sum of the excitation signals representing a single signal with uniform amplitude probability distribution. Such a set of digital signals is a maximum entropy sequence. The analog output signal of the DAC is then provided to the ADC under test. The digital time domain output signals of the ADC under test are then mapped into or transformed to a transform domain to obtain weighting coefficients of each bit of the output response. Finally the transform domain weighting coefficients are weighted by the reciprocal of the premeasured weighting coefficients to obtain the unbiased weight of each bit of the ADC under test.

The maximum entropy sequence from which excitation signals are generated according to the invention preferably comprises a set of two-state orthogonal Walsh functions, each Walsh function being separately weighted by bit position to correspond to a specific bit magnitude of the DAC used to supply an analog excitation signal to the ADC under test. In this manner the bias factor of each bit of the ADC under test can be separately identified.

The method according to the invention may be employed in an automatic test system to obtain a complete statistical description of the accuracy of conversion of the ADC under test independent of sequence of conversion.

One of the advantages and nonobvious consequences of the present invention is its ability to specify the transfer characteristics of an ADC under test by use of a nonlinear DAC. Specifically, noticeable linearity distortion in the transfer characteristic of the DAC can be tolerated provided the bit weighting coefficients of the DAC are nonzero (thus providing no information). However, an underlying assumption of the application of the invention is that the nonlinearity of the DAC must be known to at least the degree of precision implied by the bit coefficient of the least significant bit of the DAC.

A further advantage of the invention is that bias errors in the estimate of the coefficients of any maximum entropy sequence representing a DAC output are invariant for all maximum entropy sequences. Hence, the distortions introduced by the testing apparatus are virtually eliminated. An analysis of the invention shows that a ADC can be tested by using a DAC that has distortion in the transfer characteristic. Moreover, an analysis of the invention shows a large tolerance to imperfections in the DAC used as a testing device.

This invention will be better understood by reference to the following detailed description of specific embodi-

DETAILED DESCRIPTION OF SPECIFIC EMBODIMENTS

Figure 1:
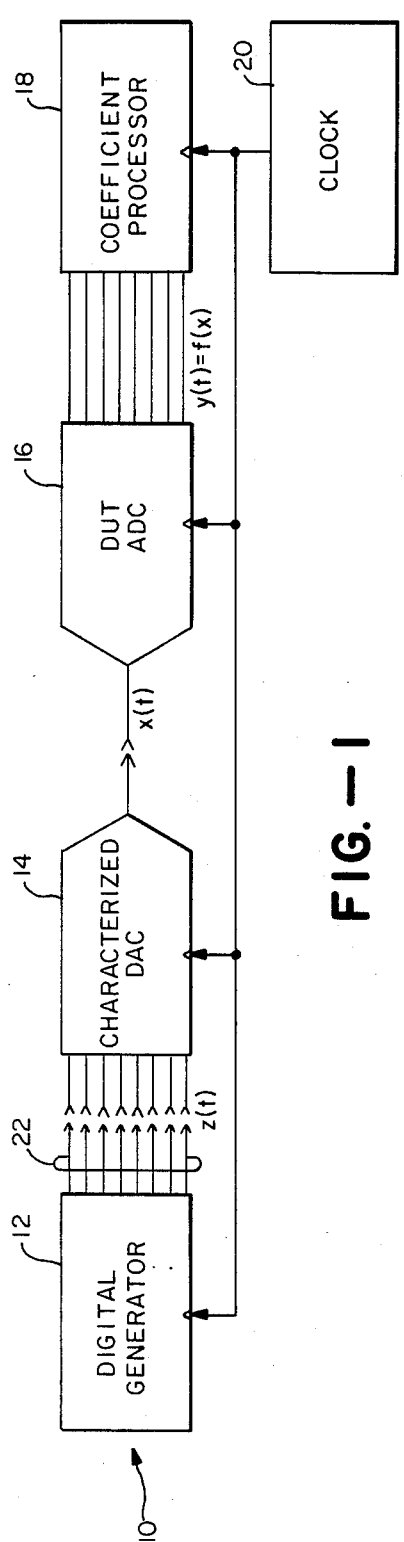
FIG. 1 is a block diagram of an apparatus operative according to the method of the invention.

FIG. 1 illustrates, in block diagram form, a test apparatus 10 which might operate according to the present invention to test an analog-to-digital converter (ADC) device under test (DUT) 16. The apparatus 10 comprises two essential elements, namely, a digital generator 12 having a specifically-defined output signal and a characterized digital-to-analog converter (DAC) 14. By "characterized," it is meant that the DAC 14 has a transfer characteristic known for each bit in terms of a set of orthogonal two-state functions, such as, for example, Walsh functions. The coefficients of the functions, which are real numbers, are thereafter employed in a coefficient processor 18 to analyze the device under test (DUT) 16, as hereinafter explained. A clock 20 provides overall synchronization for the test apparatus 10.

The generator 12 must be operative to generate a digital output signal representing a set of two-state orthogonal functions in a maximum entropy sequence. Examples of two-state orthogonal functions (strictly, their zero mean forms are orthogonal) are the sequences 0,1,0,1,0,1,0,1; 0,0,2,2, 0,0,2,2; and 0,0,0,0,4,4,4,4, which is a set of three modified Walsh functions, also the sequences 1,0,0,1,1,0,1,0; 2,0,2,0,0,2,2,0; and 0,4,0,0,4,4,4,0, which is a set of orthogonal functions which can be obtained by permuting the order of the Walsh function maximum entropy sequence. The sum of each set of three is an integer function that is uniformly distributed on the interval 0 to 7. Specifically, a maximum entropy sequence might be a discrete digitized signal defining a repetitive ramp or any other signal having uniform amplitude distribution over the sampling period of interest, as shown above. The output of the generator 12 is via a digital bus 22 wherein each signal line is a bit signal line of a different order of magnitude. Each bit of the digital bus 22 is excited by a different binary orthogonal function. Since each bit is separately and independently weighted, depending on the bit assignment, the overall output of the generator 12 is a set of binary orthogonal functions. A preferred set of binary orthogonal functions is the Walsh functions although other binary orthogonal functions having essentially equivalent characteristics are also suitable in the invention. A specific embodiment is described in reference to the Walsh functions for simplicity.

The output on bus 22 is applied to the input of the DAC device 14. Each input bit of the DAC 14 is excited by a single orthogonal function. Because the generator 12 provides a pure digital signal, the binary weights at the input form an ideal input signal from which an analog output is obtained which can be characterized in terms of Walsh functions. The DAC 14 analog output signal is applied to the device under test (DUT) ADC 16 to determine the dynamic transfer function of the DUT 16. The digital output signal can be also be described in the terms of a set of Walsh functions. When the analog pattern is applied to the input of the DUT 16.

Ideally, the output of DAC 14, x(t), should be the exact analog equivalent of the digital input pattern, z(t), applied to bus 22 by the digital generator 12. The digital pattern, z(t), being an exact maximum entropy sequence would result in an analog signal, x(t), that was also a maximum entropy sequence that has a uniform amplitude distribution over all allowable states of DAC 14. This analog signal when applied to the DUT (ADC) 16 would allow the individual bit weights, $a_m$, of the DUT 16 to be determined in accordance with this invention.

Figure 2:
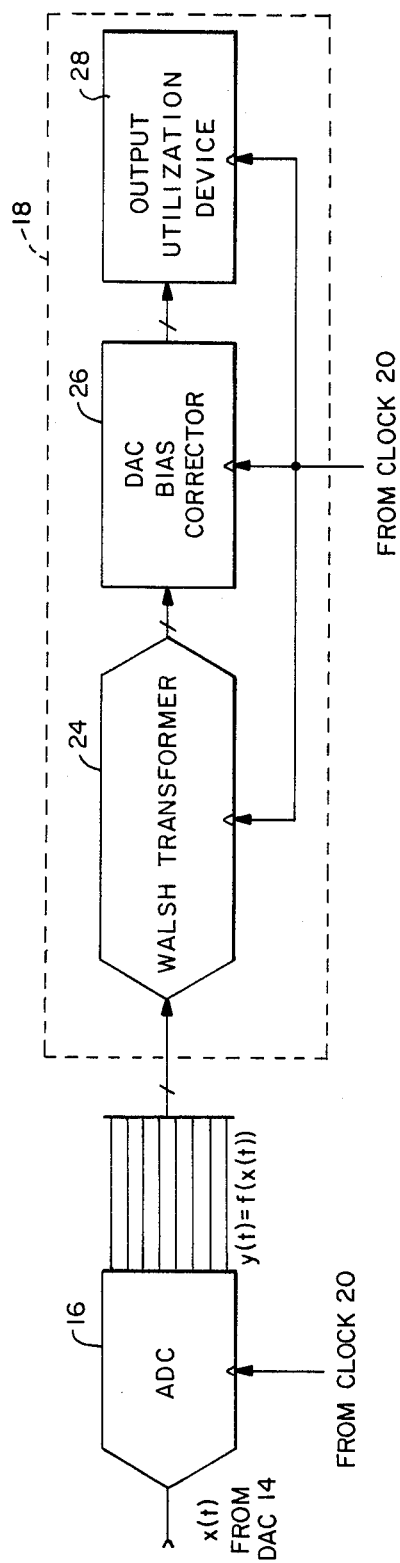
FIG. 2 is more detailed block diagram of an apparatus operative according to the method of the invention.

According to the invention, the transfer characteristics of the DUT 16, which is expressable in terms of the bit weights $a_m$, is obtained by first determining the transfer characteristic of the DAC 14, which is not ideal in general, and then measuring the digital output at each bit output of the DUT 16. Referring to FIG. 2, to this end, the coefficient processor 18 comprises a Walsh transform processor 24 having its output coupled to a bias corrector 26 which in turn has its output coupled to an output utilization device 28.

The transfer characteristic of the DAC 14 can be expressed in terms of Walsh functions with coefficients dependent upon identifiable nonlinearities which are independent of any excitation sequence. When used with the special digital generator 12, a maximum entropy sequence exciter, the bias factors introduced by the DAC 14 are invariant with respect to the choice of the set of orthogonal functions used as a specific excitation pattern as long as the excitation bit battern is a maximum entropy sequence.

It is also significant and not immediately apparent that the number of bias factors corresponds to the number of bits, i.e., the number of output lines from the DUT 16, and not to the number of allowable states of the DUT 16. The characterized bias factors are compensated for in a bias corrector 26 to which the output of the ADC 16 is applied.

The output of the bias corrector 26 is the set of output Walsh coefficients $a_m$ which characterize the DUT 16 digital signal. The signal processing of the output Walsh coefficients, as well as the characteristics of orthogonality and of Walsh functions, have been taught elsewhere, as for example in my paper entitled "Application of Walsh Functions to Converter Testing" presented Nov. 11, 1980 and published in *Proceedings of the 1980 Auto Test Conference* (IEEE 80-CH1608-9) and incorporated herein by reference. The output of the processed Walsh coefficients is applied to an output utilization device 28 such as a display device or the like.

Because it is not immediately apparent that the bias factors can be determined independently of the particular maximum entropy excitation signal, the following analysis and explanation is presented. This discussion shows the bias introduced by a nonlinear, nonideal DAC is substantially independent of the DUT device, even in dynamic testing, so long as the analog excitation signal is substantially a maximum entropy sequence and the DAC 14 nonlinearities are moderate.

The output signal, y(t), of the DUT 16 may be described in terms of the DUT excitation signal, x(t), and the DUT 16 transfer characteristic, f(x), as $$y(t) = f[x(t)] \qquad (1)$$

where x(t) is assumed to be substantially uniformly distributed (a maximum entropy sequence).

Assume that the function y(t) is defined as the sum of distortion and a sequence of weighted Walsh functions.

$$y(t) = \sum_{m=0}^{M-1} \hat{a}_m \Psi_{lm}(t) + \epsilon(t) \quad (2)$$

where
$\Psi(t)$ is a Walsh function;
l is the order of the Walsh function;
m is the bit index;
M is the total number of bits of the converter
$\hat{a}_m$ is the weight of the $m^{th}$ bit after passing through the transfer function f(x); and
$\epsilon(t)$ is a term representing residual error or noise.

It follows therefore that the coefficient $\hat{a}_m$ is the integral of the product of the function y(t) and the $l^{th}$ order Walsh function corresponding to the $m^{th}$ bit over time or $$\hat{a}_m = \frac{1}{T} \int_T y(t) \Psi_{l,m}(t) dt \quad (3)$$

$$= \frac{1}{T} \int_T f[x(t)] \Psi_{l,m}(t) dt$$

By the Ergodic Hypothesis which establishes the equivalence of time and statistical averages, it can be shown that the coefficient $\hat{a}_m$ is the expected value of the product of the function f(x) and the $l^{th}$ order Walsh function for the $m^{th}$ bit. This expected value is equal to the double integral over x and $\Psi$ of the product of $\Psi_l(x)$, f(x), and the joint amplitude density function of x and $\Psi_{l,m}(x)$ or $$\hat{a}_m = E[f(x)\Psi_{l,m}(x)] \quad (4)$$
$$= \int \int f(x)\Psi_{l,m}(x)p[x,\Psi_{l,m}] d\Psi_l dx$$

where
E[•] is the expected value of the product; and
p[•] is the joint amplitude probability density function.

The joint amplitude probability density function is a two-dimensional distribution that describes the probability that the two state Walsh function $\Psi_{l,m}(x)$ is on or off for a given value of x. Inasmuch as the variable x(t) is substantially uniformly distributed in amplitude according to the invention, then permuting the order of the excitation sequences does not change the probability that a given bit will be on or off for a given excitation value.

It therefore follows that the density function $p(x,\Psi_{l,m})$ is equal to the joint density of a given value of x occurring when the binary order, or $2m^{th}$ order, Walsh function is on or off or $$p(x,\Psi_{l,m}) = p(x,\Psi_{2m}) \quad (5)$$

for uniformly distributed x.

Hence from equation (4) above, the coefficient $\hat{a}_m$ is the expected value of the product of the $2m^{th}$ order Walsh function and function f(x) or $$\hat{a}_m = E[f(x)\Psi_{2m}(x)] \quad (6a)$$
$$= \int \int f(x)\Psi_{2m}(x)p(x,\Psi_{2m}) d\Psi dx$$
$$= \int f(x)[\int \Psi_{2m}(x)p(x,\Psi_{2m})d\Psi]dx$$

By examination of the activity of each bit of the excitation sequence it is possible to derive the density function $p(x, \Psi_{2m})$ and then integrate the density function over all possible values of x.

Table I shows the density function $p(x,\Psi)$ for a ramp $x = -1$ to $+1$ for a four-bit range, or the sum of four Walsh functions:

TABLE I

| x | $\Psi_2 0$ | | $\Psi_2 1$ | | $\Psi_2 2$ | | $\Psi_2 3$ | |
|---|---|---|---|---|---|---|---|---|
|  | $-1$ | $+1$ | $-1$ | $+1$ | $-1$ | $+1$ | $-1$ | $+1$ |
| $+15/16$ | 0 | 1/16 | 0 | 1/16 | 0 | 1/16 | 0 | 1/16 |
| $+13/16$ | 0 | 1/16 | 0 | 1/16 | 0 | 1/16 | 1/16 | 0 |
| $+11/16$ | 0 | 1/16 | 0 | 1/16 | 1/16 | 0 | 0 | 1/16 |
| $+9/16$ | 0 | 1/16 | 0 | 1/16 | 1/16 | 0 | 1/16 | 0 |
| $+7/16$ | 0 | 1/16 | 1/16 | 0 | 0 | 1/16 | 0 | 1/16 |
| $+5/16$ | 0 | 1/16 | 1/16 | 0 | 0 | 1/16 | 1/16 | 0 |
| $+3/16$ | 0 | 1/16 | 1/16 | 0 | 1/16 | 0 | 0 | 1/16 |
| $+1/16$ | 0 | 1/16 | 1/16 | 0 | 1/16 | 0 | 1/16 | 0 |
| $-1/16$ | 1/16 | 0 | 0 | 1/16 | 0 | 1/16 | 0 | 1/16 |
| $-3/16$ | 1/16 | 0 | 0 | 1/16 | 0 | 1/16 | 1/16 | 0 |
| $-5/16$ | 1/16 | 0 | 0 | 1/16 | 1/16 | 0 | 0 | 1/16 |
| $-7/16$ | 1/16 | 0 | 0 | 1/16 | 1/16 | 0 | 1/16 | 0 |
| $-9/16$ | 1/16 | 0 | 1/16 | 0 | 0 | 1/16 | 0 | 1/16 |
| $-11/16$ | 1/16 | 0 | 1/16 | 0 | 0 | 1/16 | 1/16 | 0 |
| $-13/16$ | 1/16 | 0 | 1/16 | 0 | 1/16 | 0 | 0 | 1/16 |
| $-15/16$ | 1/16 | 0 | 1/16 | 0 | 1/16 | 0 | 1/16 | 0 |

Referring to Table I, if integration of $\Psi$ is carried out in equation 6(a) over the $\Psi$ dimension, then the evaulation of equation (6a) simply becomes $$\hat{a}_m = \frac{1}{2X} \int_{-X}^{X} f(x)\Psi_{2m}(x)dx \quad (6b)$$

The transfer function f(x) of the characterized DAC 14 may be represented as a sum of Walsh functions weighted by coefficients $a_n$ or $$f(x) = \sum_{n=0}^{\infty} a_n \Psi_n(x) \quad (7)$$

Substituting equation (7) into equation (6b) for integration over all values of x, the coefficient $\hat{a}_m$ is determined to be the sum of the weighted integrated products of two Walsh functions in x normalized by the span of x, or $$\hat{a}_m = \frac{1}{2X} \sum_{n=0}^{\infty} a_n \int_{-X}^{X} \Psi_n(x)\Psi_{2m}(x)dx \quad (8)$$

Since the Walsh functions are orthogonal, the product thereof is equal to unity whenever the order is equal, and is zero otherwise, i.e., $$\frac{1}{2X} \int_{-X}^{X} \Psi_n(x)\Psi_{2m}(x)dx = 1 \quad (9)$$

for $n = 2^m$. And, $$\int \Psi_n(x)\Psi_{2m}(x)dx = 0 \quad (10)$$

for $n \neq 2^m$.

It follows immediately from equation (8) that the estimated weight $\hat{a}_m$ is equal to the weighting coefficient $a$ of the $2m^{th}$ order Walsh function that describes the transfer characteristic f(x) or $$\hat{a}_m = a_{2m} \quad (11)$$

Equation (11) implies that the nonlinearity in the DAC 14 appears as a time-independent bias in the estimate of $a_m$. Specifically, the unbiased estimate of the $m^{th}$ bit weight of the ADC 16 is the biased estimate of the weight due to all known and unknown factors introduced between the known input and the measured output at the input of the coefficient processor 18.

The estimate of the coefficient of the $m^{th}$ bit weight of the DUT 16, $\hat{a}_m$, will be biased by an error in the $\alpha_{2^m}$ coefficient which is a component parameter of the nondeal maximum entropy sequence, y(t), which is a distortion of the true maximum entropy sequence, z(t), generated by the digital generator 12 as an input to the nonlinear (non-ideal) DAC 14.

Thus, if DUT 16 were perfect, its output, y(t), would also be a quantized replica of its input x(t), resulting in a bias error of the true $m^{th}$ bit weight, $a_m$, as follows for an integer representation of bit values. It should be noted that fractional representations can be used as well, but for brevity the integer form shall be used. It is well known to those skilled in the art that equivalent fractional representation can be represented in similar form.

$$\hat{a}_m = a_m \frac{\alpha_{2^m}}{2^m} \quad (12)$$

Because $\alpha_2 m$ is known from a prior calibration of the DAC 14, and $\hat{a}_m$ is the estimate or the $m^{th}$ bit weight of DUT 16 from the Walsh processor 24, due to the response of DUT 16 to the stimulus, z(t) from the digital generator 12 that in turn resulted in the analog signal, x(t), from DAC 14, the unbiased estimate of the DUT 16 binary weights may be obtained by solving the previous equation for $a_m$, or $$\hat{a}_m = a_m \frac{2^m}{\alpha_{2^m}} \quad (13)$$

According to the invention, the bias correction terms $2^m/\alpha_2 m$ of the DAC 14 are known values stored in the ADC bias corrector 26 (FIG. 2). The output signals of the Walsh transformer 24, which are the coefficients $\hat{a}_m$ of the Walsh transform of the output y(t) signals are corrected by the bias correction terms $2^m/\alpha_2 m$ according to the relationship in equation (13) to produce the unbiased coefficients $a_m$. For example, if $\alpha_2 m$ equals $\hat{a}_m$, then the bit weight of the coefficient $a_m$ is simply $2^m$. The unbiased coefficients $a_m$ specify the transfer characteristic of the DUT 16. More particularly, the unbiased weighting coefficients $a_m$ appear in the transfer characteristic of the DUT 16 as follows:

$$f(x) = \sum_{m=0}^{M-1} a_m \Psi_{2^m}(x) \quad (14)$$

Because the $\Psi_{l,m}(x)$ is absolutely known (since it is the digital excitation function of the characterized digital generator 14), x(t) is known and the DUT 16 is calibrated.

The biased correction can also be applied as an additive correction factor as shown by the following algebriac manipulations of equation 13.

$$\hat{a}_m \frac{2^m}{\alpha_{2^m}} = a_m \quad (13)$$

Let $$a_m = 2^m + \epsilon_m \quad (15)$$

where $\epsilon_m$ is the departure from the ideal value, $2^m$, so that $$\frac{\hat{a}_m}{\alpha_{2^m}} 2^m = 2^m + \epsilon_m \quad (16)$$

or $$\hat{a}_m = \alpha_2 m + \frac{\alpha_2 m}{2^m} \epsilon_m$$

Adding $2^m$ to both sides of equation 16 and rearranging terms yields, $$\hat{a}_m + 2^m - \alpha_2 m = 2^m + \frac{\alpha_2 m}{2^m} \epsilon_m \quad (17)$$

Because $$\frac{\alpha_2 m}{2^m} \simeq 1 \quad (18)$$

and because $$a_m = 2^m + \alpha_2 m \quad (19)$$

$$\hat{a}_m + (2^m - \alpha_2 m) = a_m \quad (20)$$

Expression 20 shows that the biased bit weight, $\hat{a}_m$, may be corrected by the additive term shown in brackets, i.e. the difference between the ideal weight, $\alpha 2^m$, and the biased weight of the DAC, $\alpha_2$m. It should be clear from the above that one can also form an equivalent subtractive correction factor of the form $$\hat{a}_m - (\alpha_2 m - 2^m) = a_m$$

Many forms of digital excitation signals are suitable in the invention. A signal particularly well suited is the set of individual binary signals which represents a linear amplitude ramp which may be repeated.

The invention has now been explained in respect of specific embodiments. Other embodiments will be apparent to those of ordinary skill in this art. It is therefore not intended that the invention be limited except as indicated in the appended claims.

What is claimed is:

1. A method for calibrating an analog-to-digital converter (ADC) comprising the steps of:

exciting a plurality of inputs of a digital-to-analog converter (DAC) from an excitation means generating known digital excitation signals, each said excitation signal being applied at a single digital bit input of the DAC and each said excitation signal being binary and orthogonal with respect to all other ones of said plurality of excitation signals, the sum of said excitation signals constituting a maximum entropy sequence of substantially uniform amplitude probability, said DAC producing an analog output signal, the transfer function of said DAC having been characterized by premeasured bit weighting values;

providing said analog output signal of the DAC to an analog input of the analog-to-digital converter (ADC) under test, said ADC producing digital output signals;

transforming said digital output signals from time domain digital signals into binary transform domain digital signals to obtain an output response weighting coefficient for each bit of the converter under test; and correcting each said output response weighting coefficient for bias errors induced by said DAC by adding to each output response weighting coefficient the corresponding difference between the ideal binary weights and said premeasured bit weighting values in a bias correction means in order to obtain unbiased weighting values of each bit specifying the transfer characteristic of the ADC under test.

2. The method according to claim 1 wherein the digital excitation signals are Walsh function signals.

3. The method according to claim 2 wherein the transforming step comprises transforming time domain digital signals into corresponding Walsh transform domain signals.

4. The method according to claim 3 wherein said digital excitation signals comprise together a digital representation of a linear amplitude ramp.

5. The method according to claim 1 wherein the unbiased weighting coefficient of the $m^{th}$ bit of analog-to-digital converter under test is represented by:

$$a_m = \hat{a}_m + c_m$$

where
$\hat{a}_m$ is the output response weighting coefficient of the $m^{th}$ bit; and
$c_m$ is a coefficient based on the ideal output of said digital-to-analog converter and the corresponding premeasured weighting value of the digital-to-analog converter.

6. An apparatus for calibrating an analog-to-digital converter (ADC) comprising:

means for exciting inputs of a digital-to-analog converter (DAC) from an excitation means operative to generate known digital excitation signals at selected digital excitation signal outputs, each said excitation signal output being adapted to be coupled to a single digital bit input of the DAC under test and each said excitation signal constituting a maximum entropy sequence of substantially uniform amplitude probability, said DAC producing an analog output signal at an analog output signal terminal, the transfer function of said DAC having been characterized by premeasured weighting values of a set of binary orthogonal functions;

the ADC under test adapted to be coupled to said DAC analog output signal terminal, said ADC under test being operative to produce digital output signals in response to said analog output signal;

means for transforming said digital output signals from time domain digital signals into binary transform domain digital signals to obtain an output response weighting coefficient for each bit of the converter under test; and means for correcting each said output response weighting coefficient for bias errors induced by said DAC by adding to each output response weighting coefficient the corresponding difference between the ideal binary weights and said premeasured weighting values in order to obtain unbiased weighting values of each bit specifying the transfer characteristic of the analog-to-digital converter under test.

7. The apparatus according to claim 6 wherein said exciting means is a Walsh function signal generator.

8. The apparatus according to claim 7 wherein the transforming means comprises means for transforming time domain digital signals into corresponding Walsh transform domain signals.

9. The apparatus according to claim 8 wherein said digital excitation signals comprise together a digital representation of a linear amplitude ramp.

10. The apparatus according to claim 6 wherein said unbiased weighting coefficient of the $m^{th}$ bit of a digital-to-analog converter under test is represented by:

$$a_m = \hat{a}_m c_m$$

where
$\hat{a}_m$ is the output response weighting coefficient of the $m^{th}$ bit; and
$c_m$ is a coefficient based on the ideal output of said digital-to-analog converter and the corresponding premeasured weighting value of the digital-to-analog converter.

* * * * *